United States Patent [19]

Bonaccio

[11] Patent Number: 5,548,452
[45] Date of Patent: Aug. 20, 1996

[54] QUAD BURST SERVO DEMODULATOR WITH ADJUSTABLE SLEW RATE FOR HARD DISK DRIVES

[75] Inventor: Anthony R. Bonaccio, Shelburne, Vt.

[73] Assignee: International Business Machines Corporation, Armonk, N.Y.

[21] Appl. No.: 356,984

[22] Filed: Dec. 15, 1994

[51] Int. Cl.$^6$ ..................................... G11B 5/09
[52] U.S. Cl. ..................... 360/46; 360/67; 360/77.08
[58] Field of Search ................... 360/46, 67, 77.08

[56] References Cited

U.S. PATENT DOCUMENTS

| | | | |
|---|---|---|---|
| 4,669,004 | 5/1987 | Moon et al. | 360/77 |
| 4,698,523 | 10/1987 | Gershon et al. | 307/351 |
| 4,879,478 | 11/1989 | Gershon | 307/353 |
| 5,041,773 | 8/1991 | Takahashi | 360/77.08 X |
| 5,063,549 | 11/1991 | Yamamuro | 369/44.32 X |
| 5,115,360 | 5/1992 | Sidman | 360/77.08 |
| 5,276,564 | 1/1994 | Hessing et al. | 360/51 |
| 5,311,376 | 5/1994 | Joan et al. | 360/51 |
| 5,315,449 | 5/1994 | Dayton et al. | 360/66 X |
| 5,388,010 | 2/1995 | Norton, Jr. | 360/46 |

*Primary Examiner*—W. Chris Kim
*Attorney, Agent, or Firm*—Schmeiser, Olsen & Watts; Eugene I. Shkurko

[57] ABSTRACT

A quad burst servo demodulator with adjustable slew rate for hard disk drives. The quad burst servo demodulator includes a peak voltage detecting system for detecting the peak voltages of an input signal, a plurality of storage capacitors for holding voltages proportional to the peak voltages observed by the peak voltage detecting system, and a programmable current source for charging (via an adjustable slew rate) the storage capacitors to voltages proportional to the detected peak voltages of the input signal.

12 Claims, 4 Drawing Sheets

QUAD BURST SERVO DEMODULATOR WITH ADJUSTABLE SLEW RATE FOR HARD DISK DRIVES

CROSS REFERENCE TO RELATED APPLICATIONS

Reference is hereby made to co-pending United States patent application Ser. No. 08/356,816 by Bonaccio (Bonaccio, BU9-94-126), entitled "Precision Level Shifter," filed Dec. 15, 1994 and assigned to the assignee of the present invention. The above-referenced, co-pending patent application is directed to a precision level shifter for shifting the voltage on a storage capacitor to a higher voltage which is more easily processible by the detection circuitry within a quad burst servo demodulator circuit.

BACKGROUND OF THE INVENTION

1. Technical Field

The present invention relates generally to hard disk drives and, more particularly, to a quad burst servo demodulator for recovering the peak amplitudes of hard disk drive servo burst waveforms, and for converting the recovered AC voltage waveforms to DC voltages for subsequent digital processing.

2. Background Art

As known in the art, hard disk drives typically utilize an embedded servo field having a specific pattern for positioning of the read/write head. This pattern, written permanently onto the disk at the time of its manufacture, generally includes four "bursts" of alternating magnets (dibits), with two of the bursts recorded off the center of a track. By reading the relative strengths of the electrical signals produced when the read head of the hard disk drive passes over these bursts, a feedback control loop can be established to position the head exactly over the center of a specific track.

Two systems for reading the relative strengths of the servo burst waveforms are in wide use today: peak detectors and area integrators. Peak detectors quickly acquire and store the peak amplitudes of the waveforms during each burst, usually on discrete internal or external capacitors. Integrating detectors calculate and store the area under the burst voltage verses time curve for each burst.

Examples of existing systems for reading burst waveforms may be found in the following United States Patents, each incorporated herein by reference: U.S. Pat. No. 4,669,004, "High Capacity Disk File with Embedded Sector Servo," (issued May 1987 to Moon et al. and assigned to Quantum Corp.); U.S. Pat. No. 4,698,523, "Servo Data Demodulator," (issued October 1987 to Gershon et al. and assigned to Advanced Micro Devices, Inc.); U.S. Pat. No. 4,879,478, "Fast Sample and Hold Circuit," (issued November 1989 to Gershon and assigned to Advanced Micro Devices, Inc.); U.S. Pat. No. 5,115,360, "Embedded Burst Demodulator and Tracking Error Generation," (issued May 1992 to Sidman and assigned to Digital Equipment Corp.); U.S. Pat. No. 5,276,564, "Programmable Start-of-Sector Pulse Generator for Disk Drive Using Embedded Servo Bursts and Split Data Fields," (issued January 1994 to Hessing et al. and assigned to Hewlett-Packard); and U.S. Pat. No. 5,311,376, "Information Detecting System," (issued May 1994 to Joan et al. and assigned to Western Digital).

Although peak burst waveform detecting circuits are easy to implement, they are overly sensitive to noise; a noise "glitch" occurring at or near the peak of the burst waveform will be stored by the peak detector and give incorrect results. Integrating detectors are much less sensitive to noise, since they do not track and hold peak information, but are more complex to implement.

SUMMARY OF THE INVENTION

It is thus an object of the present invention to provide a quad burst servo demodulator with an adjustable slew rate for accurately recovering and storing the peak amplitudes of hard disk drive servo burst waveforms, without the inherent noise sensitivity of currently available peak burst waveform detecting circuits.

It is an additional object of the present invention to provide a quad burst servo demodulator incorporating a programmable current source for adjustably and controllably charging a storage capacitor to a voltage proportional to the differential peak-to-peak amplitude of a burst waveform.

As detailed hereinbelow, the foregoing and other objects of the present invention are achieved by a quad burst servo demodulator generally employing a unique arrangement of a peak voltage detecting system for detecting the peak voltages of an input signal, a plurality of storage capacitors for holding voltages proportional to the peak voltages observed by the peak voltage detecting system, and a programmable current source for charging (via an adjustable slew rate) the storage capacitors to voltages proportional to the detected peak voltages of the input signal.

BRIEF DESCRIPTION OF THE DRAWINGS

The foregoing and other objects, features and advantages of the present invention will be apparent from the following more particular description of the invention, as illustrated in the accompanying drawings.

DETAILED DESCRIPTION OF THE BEST MODE FOR CARRYING OUT THE INVENTION

Figure 1:
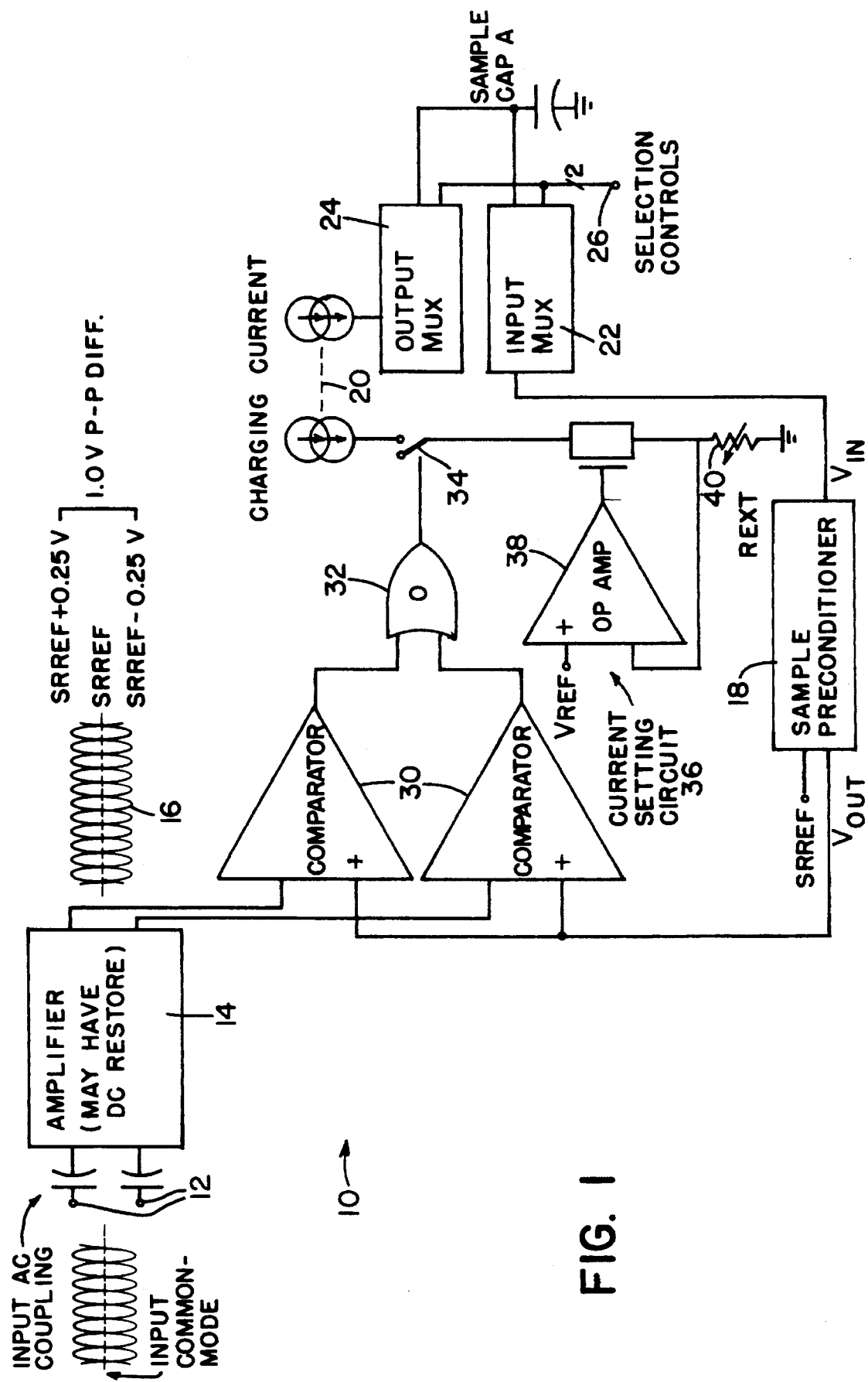
FIG. 1 is a circuit diagram of a quad burst servo demodulator circuit in accordance with a preferred embodiment of the present invention.

Referring now specifically to the drawings, there is illustrated a quad burst servo demodulator, generally designated as 10, in accordance with a preferred embodiment of the present invention, wherein like reference numerals refer to like components throughout the drawings.

As illustrated in FIG. 1, the quad burst servo demodulator 10 utilizes an input signal that is symmetric around a DC common-mode voltage. The input signal is provided by AC-coupling an input signal from the prior stage in the hard disk drive read channel via AC-coupling capacitors 12. If the prior stage in the hard disk drive read channel has programmable or dynamically adjusted characteristics, any offsets that may result from these changes must be given time to settle out before the present invention will operate properly; the AC-coupling capacitors 12 must be given sufficient time to charge to the correct value.

A differential amplifier 14, having fixed or adjustable gain, receives the AC-coupled input waveform from the previous stage. If a DC restore function is not provided by other circuits receiving the AC-coupled input waveform, the differential amplifier 14 may include a DC restore function to set the common-mode voltage at the inputs of the differential amplifier to a convenient level. The differential amplifier 14 is designed to provide a symmetric differential output waveform 16 around a known common-mode level, referred hereinafter as SRREF.

In accordance with the present invention, a voltage proportional to each of the differential peak-to-peak amplitudes of the four servo burst waveforms is stored on a respective one of four external storage capacitors. For simplicity, only one of the external capacitors, CAP A, is illustrated in FIG. 1. The storage capacitors are selectively coupled to a sample preconditioner 18 and a current mirror arrangement 20 by input and output multiplexers 22 and 24, respectively, each of which is controlled by internal logic. The internal logic is in turn controlled by Gate and Strobe selection controls 26, which are provided by the external application. The two multiplexers are mutually configured in a "Kelvin connection" so that the voltage presented to the sample preconditioner 18 via the input multiplexer 22 is not affected by the voltage (IR) drop through the output multiplexer 24.

The voltage stored on each of the storage capacitors (e.g. CAP A) is sampled by the sample preconditioner 18 and is converted (level shifted) to a level which is referenced to the same voltage (SRREF) as that used for the common-mode output level of the differential amplifier 14. Voltage level shifting is required because the storage capacitors are externally reset to ground (0 V) during non-servo intervals. Such low voltages would be difficult for the detection circuitry to process without first level shifting them. Although the specific operation of the sample preconditioner 18 is disclosed in detail in the above-referenced co-pending patent application, a brief, simplified description of the operation of the sample preconditioner is provided below.

Figure 2:
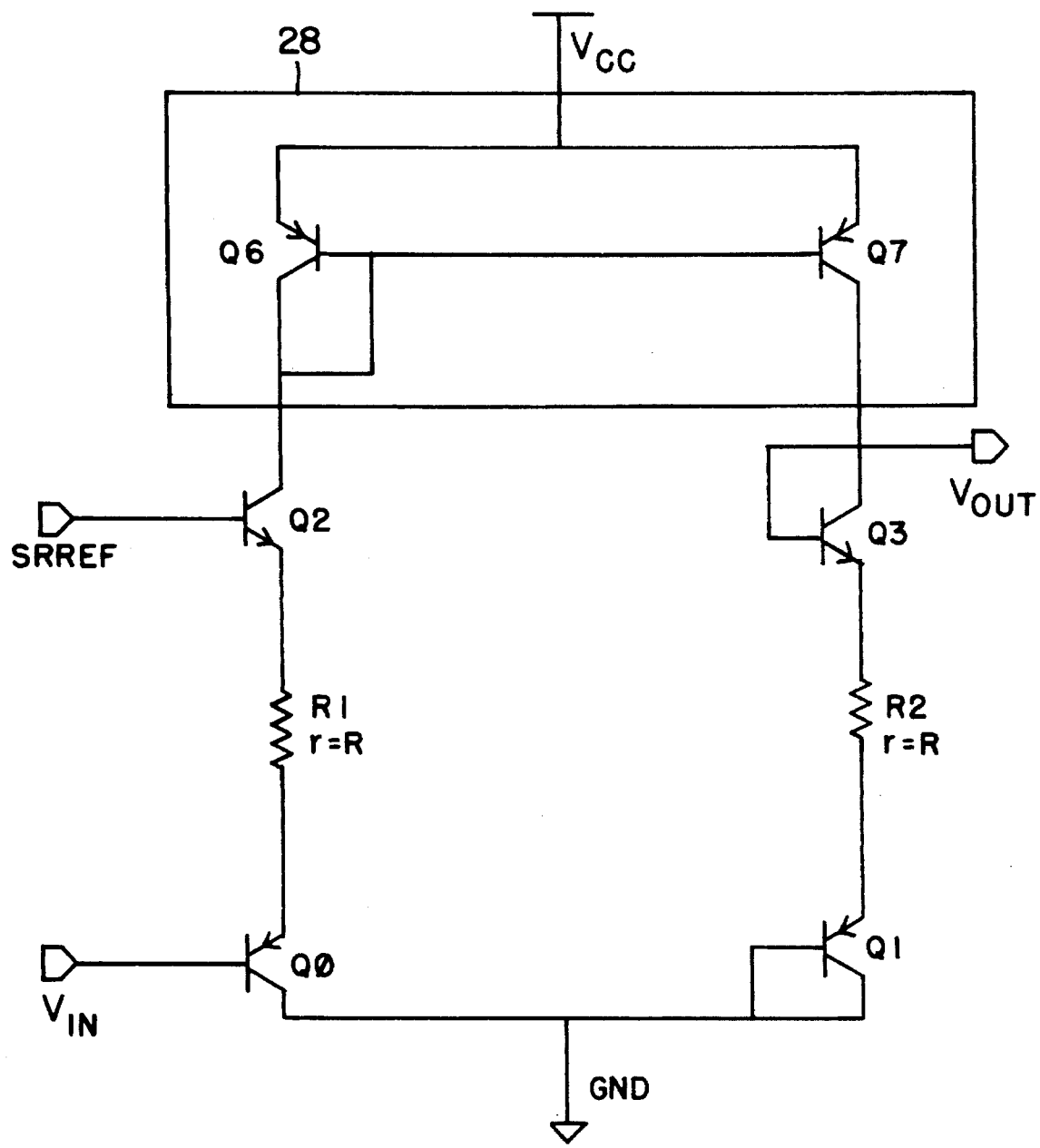
FIG. 2 is a circuit diagram illustrating the sample preconditioner utilized in the quad burst servo demodulator circuit of FIG. 1.

As shown in FIG. 2, the sample preconditioner includes first and second current legs coupled by a current mirror arrangement 28 formed in a conventional manner using a pair of bipolar PNP transistors Q6 and Q7. The first current leg includes a bipolar NPN transistor Q2 arranged in series with a biasing resistor $R_1$ and a bipolar PNP transistor Q0. An input voltage $V_{in}$ is applied to the base of transistor Q0, with the collector of transistor Q0 coupled to ground (gnd). The emitter of transistor Q2 is coupled through $R_1$ to the emitter of transistor Q0, thereby establishing a current path from the collector of transistor Q2 to ground. Finally, a reference voltage SRREF is applied to the base of transistor Q2.

The second current leg comprises a diode-connected bipolar NPN transistor Q3 connected in series with a biasing resistor $R_2$ and a diode-connected bipolar PNP transistor Q1 having its base and collector coupled to ground. An output voltage $V_{OUT}$ is provided at the collector of transistor Q3.

By applying standard circuit analyzing techniques, given that $R_1=R_2$, $I_{C3} \approx I_{C0}$, $V_{BE0} \approx -V_{BE2}$ and $V_{BE1} \approx -V_{BE3}$, the output voltage $V_{OUT}$ is found to be:

$$V_{OUT}=SRREF-V_{in} \qquad (1)$$

Thus, the sample preconditioner 18 is adapted to convert an input voltage $V_{in}$, which may take on values approaching the least positive power supply, to an output voltage $V_{OUT}$ referenced to a higher, more usable voltage.

The voltage level shift to the common-mode output voltage of the amplifier (SRREF) is required because the signal preconditioner 18 is connected to the storage capacitors via an input multiplexer, which, in turn, is controlled by the same inputs as the output multiplexer. Further, the input of the sample preconditioner 18 preferably contains, as detailed in the above-referenced co-pending patent application, an attenuation network, wherein the actual voltage observed on a storage capacitor is larger, in accordance with the attenuation factor of the attenuation network, than the output of the signal preconditioner.

Referring again to FIG. 1, the outputs of the differential amplifier 14 and the sample preconditioner 18 are connected to the inputs of two comparator circuits 30. The outputs of the comparator circuits 30 pass through an OR gate 32, subsequently driving a switch 34 which steers a programmable slew current, provided by a current-setting circuit 36, into the current mirror 20. The current mirror 20 is selectively connected via the output multiplexer 24 to CAP A or one of the remaining storage capacitors (not shown). Of course, the remaining storage capacitors are sequentially selected by the output multiplexer 24 under control of the Gate and Strobe selection controls 26. Whenever either the positive or negative phase of the differential amplifier output 16 is less than the voltage on a selected storage capacitor (after level shifting by the sample preconditioner), the switch 34 closes and the current mirror 20 pumps current provided by the current-setting circuit 36 into the storage capacitor. In the preferred embodiment of the present invention, the current used to charge the storage capacitors is typically on the order of 1 to 10 mA DC.

It should be noted that the selected storage capacitor is charged when the output 16 of the differential amplifier 14 is less than the output of the sample preconditioner. This occurs because the sample preconditioner 18 inverts its input signal: the output of the sample preconditioner 18 decreases from SRREF as the voltage on the selected storage capacitor increases. Accordingly, packets of charge are delivered to the selected storage capacitor during those intervals where the peak of the burst waveform exceeds the capacitor voltage times some adjustable gain factor. For simplicity, the gain factor, which is set by the attenuation factor of the sample preconditioner, can be assumed to be 1. As the capacitor voltage approaches the peak of the burst waveform, the charge packets become smaller and smaller. If a noise glitch occurs, the detection circuitry will not react quickly enough to generate a significant charge packet onto the capacitor. Hence, this system is less susceptible to errors due to noise.

As stated above, the programmable slew current supplied to the current mirror 20 is provided by the current-setting circuit 36. As illustrated in FIG. 1, the current-setting circuit includes an operational amplifier 38, having an input reference voltage $V_{ref}$, and an external precision resistor 40. The reference voltage $V_{ref}$, the resistance of the external resistor 40 and the current mirror multiplication factor can be suitably manipulated to provide a range of maximum slew rates.

Figure 3:
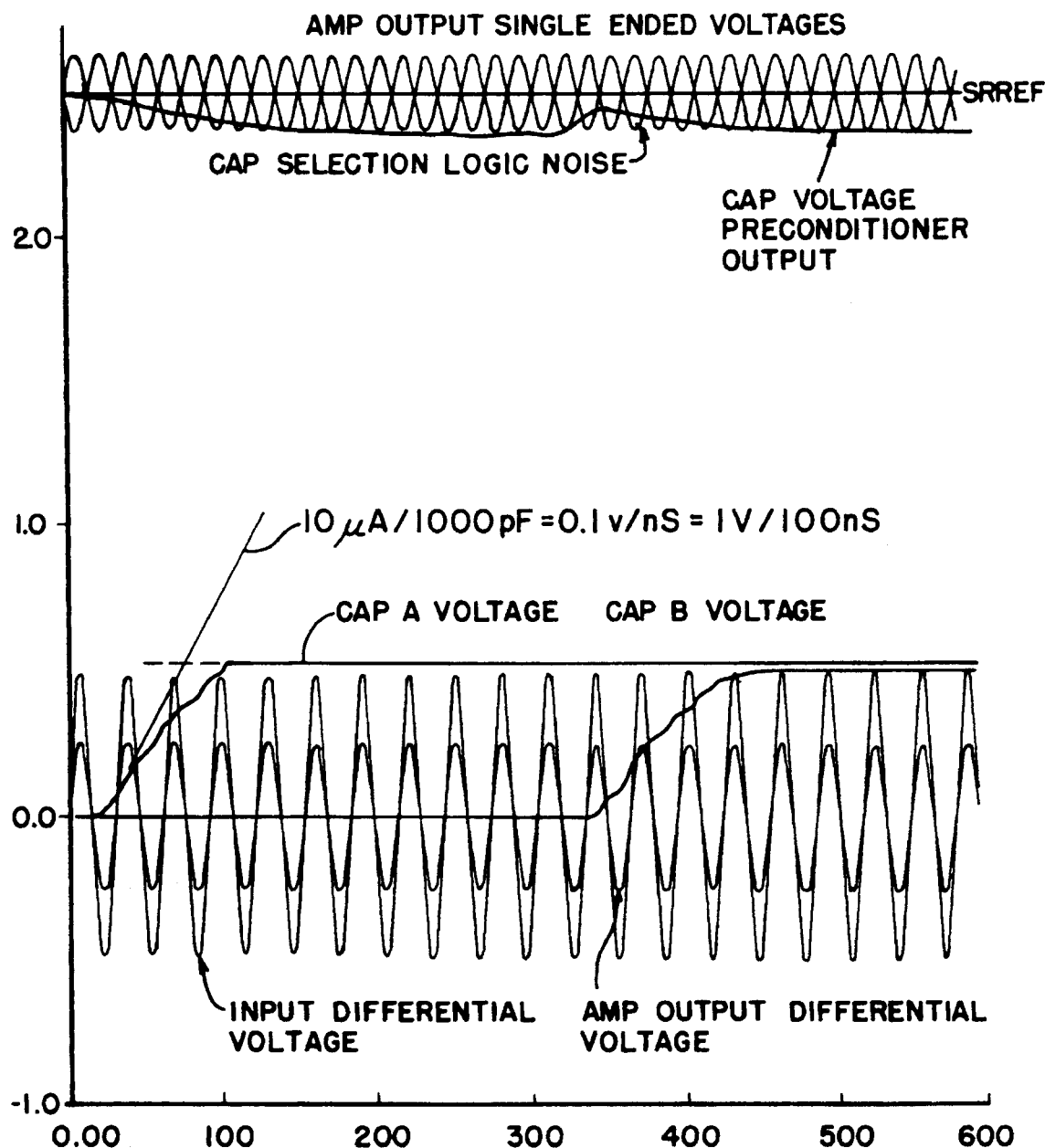
FIG. 3 illustrates typical waveforms produced by the quad burst servo demodulator circuit of the present invention during the consecutive charging cycles of two storage capacitors.

Typical waveforms produced by this quad burst servo demodulator of the present invention during the consecutive charging cycles of two storage capacitors (CAP A and CAP B) are presented in FIG. 3. The waveforms illustrated in FIG. 3 were obtained by setting CAP A and CAP B to 1000 pF and by supplying a charging current of 10 mA, thereby resulting in a slew rate limit of 10 mV/nS. The gain of the differential amplifier 14 was set to 0.5 and the attenuation factor of the sample preconditioner 18 was set so that CAP A and CAP B were charged to the peak-to-peak differential voltage at the output of the differential amplifier (attenuation factor of 0.25).

Figure 4:
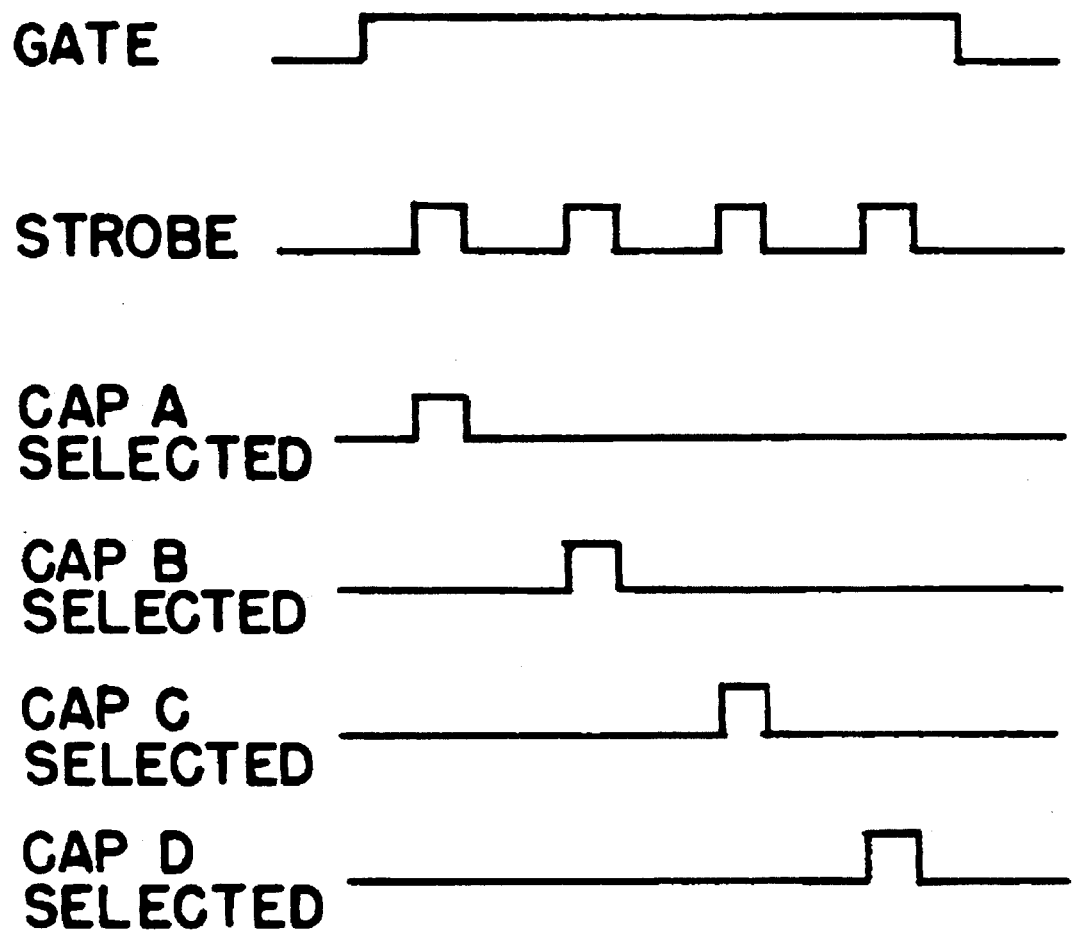
FIG. 4 illustrates typical multiplexer selection and control waveforms.

Typical Gate and Strobe selection controls 26 are shown in FIG. 4. The Gate input is used to enable the entire system, while each positive-going transition of the Strobe input that occurs during the interval when the Gate input is positive selects the next storage capacitor in the sequence CAP A→CAP B→CAP C→CAP D. It should be note noted that external discharge of the capacitors is required.

While the invention has been particularly shown and described with reference to preferred embodiments thereof, it will be understood by those skilled in the art that the foregoing and other changes in form and details may be made therein without departing from the spirit and scope of the invention.

I claim:

1. A circuit in a controller comprising:
    detecting means for detecting a peak voltage of an input signal occurring at a predetermined time interval, wherein said detecting means further includes:
    an amplifier for converting said input signal to an amplified signal which is symmetric about a predetermined common-mode level;
    a level shifter for shifting the voltage on said capacitive means to an output voltage referenced to said predetermined common-mode level;
    comparator means for comparing the amplified signal produced by said amplifier to the output voltage of said level shifter;
    capacitive means for holding a voltage proportional to said detected peak voltage; and
    an adjustable current source, coupled to said detecting means and said capacitive means, for setting and producing a chafing current, said charging current charging said capacitive means to said proportional voltage.

2. The circuit according to claim 1, wherein said capacitive means includes a plurality of discrete capacitors, said quad burst servo demodulator circuit further including:
    an output multiplexer for selectively applying the charging current produced by said current source to one of said capacitors; and
    and input multiplexer for selectively applying the voltage on one of said capacitors to said level shifter.

3. The circuit according to claim 1, further including switch means, coupled to an output of said comparator means, for selectively directing the charging current produced by said current source to said capacitive means.

4. A circuit in a controller comprising:
    detecting means for detecting a peak voltage of an input signal occurring at a predetermined time interval;
    capacitive means for holding a voltage proportional to said detected peak voltage; and
    an adjustable current source, coupled to said detecting means and said capacitive means, for setting and producing a charging current, said charging current charging said capacitive means to said proportional voltage; wherein said current source further includes a charging current setting circuit including:
    an operational amplifier including an inverting input and a noninverting input, wherein a reference voltage is applied to said noninverting input; and
    a resistor having a predetermined resistance, said resistor including a first end coupled to both an output and the inverting input of said operational amplifier, and a second and coupled to ground;
    wherein the charging current produced by said current source is adjustably controlled by adjusting said reference voltage and the predetermined resistance of said resistor.

5. A circuit in a controller comprising:
    detecting means for detecting a peak voltage of an input signal occurring at a predetermined time interval;
    capacitive means for holding a voltage proportional to said detected peak voltage, wherein said capacitive means includes a plurality of discrete capacitors, said circuit further including:
    an output multiplexer for selectively applying the charging current produced by said current source to one of said capacitors; and
    an input multiplexer for selectively applying the voltage on one of said capacitors to said detecting means; and
    an adjustable current source, coupled to said detecting means and said capacitive means, for setting and producing a charging currents, said charging current charging said capacitive means to said proportional voltage.

6. A method for recovering peak voltages of quad burst servo waveforms, comprising the steps of detecting a peak voltage of an input signal occuring at a predetermined time interval, wherein said detecting step further includes the steps of:
    converting said input signal to an amplified signal which is symmetric about a predetermined common-mode level;
    shifting the voltage of said capacitive arrangement to an output voltage referenced to said predetermined common-mode level; and
    comparing the amplified signal produced during said converting step to the output voltage of said shifting step;
    providing a capacitive arrangement for storing a voltage proportional to said detected peak voltage, and
    coupling an adjustable current source to said capacitive arrangement, said current source setting and producing a charging current, said charging current charging said capacitive arrangement to said proportional voltage.

7. The method for recovering peak amplitudes of quad burst servo waveforms according to claim 6, further including the step of:
    selectively directing the charging current produced by said current source to said capacitive arrangement.

8. A circuit in a servo controller comprising:
    a) detecting means for detecting a peak voltage of an input signal occurring at a predetermined time interval, wherein said detecting means further includes:
        i) an amplifier for converting said input signal to an amplified signal which is symmetric about a predetermined common-mode level;
        ii) a level shifter for shifting the voltage on said capacitive means to an output voltage referenced to said predetermined common-mode level; and
        iii) comparator means for comparing the amplified signal produced by said amplifier to the output voltage of said level shifter;
    b) capacitive means for holding a voltage proportional to said detected peak voltage; and
    c) a current source, coupled to said detecting means and said capacitive means, for producing a charging current, said charging current charging said capacitive means to said proportional voltage.

9. The circuit according to claim 8, further including switch means, coupled to an output of said comparator means, for selectively directing the charging current produced by said current source to said capacitive means.

10. The circuit according to claim 8, wherein said current source further includes a charging current setting circuit comprising:

an operational amplifier including an inverting input and a noninverting input, wherein a reference voltage is applied to said noninverting input; and a resistor having a predetermined resistance, said resistor including a first end coupled to both an output and the inverting input of said operational amplifier, and a second end coupled to ground;

wherein the charging current produced by said current source is adjustably controlled by adjusting said reference voltage and the predetermined resistance of said resistor.

11. The circuit according to claim 8 wherein said capacitive means includes a plurality of discrete capacitors, said circuit further including:

an output multiplexer for selectively applying the charging current produced by said current source to one of said capacitors; and and input multiplexer for selectively applying the voltage on one of said capacitors to said detecting means.

12. A method for recovering peak voltages of quad burst servo waveforms, comprising the steps of:

detecting a peak voltage of an input signal occurring at a predetermined time interval;

providing a capacitive arrangement for storing a voltage proportional to said detected peak voltage, and wherein said capacitive arrangement includes a plurality of discrete capacitors, further including the steps of:

selectively applying the charging current produced by said current source to one of said capacitors; and selectively utilizing the voltage on said one of said capacitors as a feedback signal for determining the accuracy of said detected peak voltage during said detecting step; and coupling an adjustable current source to said capacitive arrangement, said current source getting and producing a charging current, said charging current charging said capacitive arrangement to said proportional voltage.

* * * * *